(12) United States Patent
Ditzel et al.

(10) Patent No.: US 8,898,616 B2
(45) Date of Patent: *Nov. 25, 2014

(54) SOFTWARE CONTROLLED TRANSISTOR BODY BIAS

(71) Applicant: Intellectual Venture Funding LLC, Carson City, NV (US)

(72) Inventors: David R. Ditzel, Los Altos Hills, CA (US); James B. Burr, Foster City, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/741,246

(22) Filed: Jan. 14, 2013

(65) Prior Publication Data

US 2014/0033160 A1 Jan. 30, 2014

Related U.S. Application Data

(63) Continuation of application No. 13/168,896, filed on Jun. 24, 2011, now Pat. No. 8,370,785, which is a continuation of application No. 12/033,832, filed on Feb. 19, 2008, now Pat. No. 7,996,809, which is a continuation of application No. 10/334,638, filed on Dec. 31, 2002, now Pat. No. 7,334,198.

(51) Int. Cl.
G06F 17/50 (2006.01)
G06F 1/32 (2006.01)

(52) U.S. Cl.
CPC ............... *G06F 17/50* (2013.01); *G06F 1/324* (2013.01); *Y02B 60/1285* (2013.01); *G06F 1/3296* (2013.01); *Y02B 60/1217* (2013.01); *G06F 1/3203* (2013.01)

USPC ........... 716/133; 716/104; 716/110; 716/132

(58) Field of Classification Search
USPC .................................. 716/104, 110, 132, 133
See application file for complete search history.

(56) References Cited

U.S. PATENT DOCUMENTS

| 5,594,371 | A | * | 1/1997 | Douseki ..................... 326/119 |
|-----------|---|---|--------|----------------------------------|
| 5,689,144 | A | * | 11/1997 | Williams ..................... 307/130 |
| 6,023,641 | A | * | 2/2000 | Thompson ..................... 607/9 |
| 6,034,444 | A | * | 3/2000 | Kuruma et al. ................. 307/80 |
| 6,035,407 | A | * | 3/2000 | Gebara et al. ................. 713/300 |
| 6,048,746 | A | * | 4/2000 | Burr ............................ 438/17 |
| 6,087,892 | A | * | 7/2000 | Burr ............................ 327/534 |
| 6,091,283 | A | * | 7/2000 | Murgula et al. .............. 327/537 |
| 6,218,708 | B1 | * | 4/2001 | Burr ............................ 257/372 |
| 6,218,892 | B1 | * | 4/2001 | Soumyanath et al. ........ 327/537 |
| 6,303,444 | B1 |  | 10/2001 | Burr |
| 6,484,265 | B2 | * | 11/2002 | Borkar et al. ................. 713/324 |
| 6,489,224 | B1 |  | 12/2002 | Burr |
| 6,621,325 | B2 | * | 9/2003 | Hart et al. ..................... 327/534 |
| 6,777,978 | B2 |  | 8/2004 | Hart et al. |

(Continued)

OTHER PUBLICATIONS

Nose et al., "Vth-hopping scheme for 82% power Saving in Low-Voltage Processors", IEEE Conference on Custom Integrated Circuits, May 6, 2001, pp. 93-96.

(Continued)

*Primary Examiner* — Sun Lin

(57) ABSTRACT

Software controlled transistor body bias. A target frequency is accessed. Using software, transistor body-biasing values are determined for the target frequency in order to enhance a characteristic of a circuit. The bodies of the transistors are biased based on the body-biasing values, wherein the characteristic is enhanced.

20 Claims, 8 Drawing Sheets

(56) References Cited

U.S. PATENT DOCUMENTS

| | | | |
|---|---|---|---|
| 6,967,522 B2 | 11/2005 | Chandrakasan et al. | |
| 6,967,552 B2 * | 11/2005 | Aoyama et al. | 336/90 |
| 7,120,804 B2 * | 10/2006 | Tschanz et al. | 713/300 |
| 2002/0029352 A1 | 3/2002 | Borkar et al. | |
| 2002/0171468 A1 | 11/2002 | Bryant et al. | |
| 2002/0173825 A1 | 11/2002 | Thompson | |

OTHER PUBLICATIONS

Keshavarzi et al.,"Effectiveness of Reverse Body Bias for Leakage Control in Scaled Dual Vt CMOS ICs", IEEE International Symposium on Low Power Electronics and Design, Aug. 6, 2001, pp. 207-212.

Tschanz et al., "Adaptive Body Bias for Reducing Impacts of Die-to-Die and Within-Die Parameter Variations on Microprocessor Frequency and Leakage", IEEE ISSCC Conference, Feb. 3, 2002, Whole Document.

Tschanz et al. ,"Effectiveness of Adaptive Supply Voltage and Body Bias for Reducing Impact of Parameter Variations in Low Power and High Performance Microprocessor", IEEE Symposium on VLSI Circuits, Digest of Technical Papers, Jun. 13, 2002, pp. 310-311.

Kim et al.,"Dynamic Vth Scaling Scheme for Active Leakage Power Reduction", Aug. 2002, IEEE Proceedings, 2002 Design, Automation and Test in Europe Conference and Exhibition, pp. 163-167.

Kim et al.,"Dynamic Vth Scaling Scheme for Active Leakage Power Reduction", Aug. 2002, Abstract, IEEE Proceedings, 2002 Design, Automation and Test in Europe Conference and Exhibition, 3 pages.

"Proceedings, 2002 Design, Automation and Test in Europe Conference and Exhibition", Mar. 2002, IEEE, Cover page & Table of Contents, 20 pages.

IEEE Xplore Search Report on "Proceedings, 2002 Design, Automation and Test in Europe Conference and Exhibifion", Mar. 2002, 4 pages.

* cited by examiner

700

| $f_{max}$ (MHz) | $V_{dd}$ (VOLTS) | $V_{pw}$ (VOLTS) | $V_{nw}$ (VOLTS) |
|---|---|---|---|
| 1000 | 1.2 | 0.2 | -0.2 |
| 800 | 1.0 | 0 | 0 |
| 600 | 0.9 | -1 | 1 |
| 400 | 0.8 | -2 | 2 |

FIGURE 7

SOFTWARE CONTROLLED TRANSISTOR BODY BIAS

RELATED APPLICATIONS

This is a Continuation Application of, and claims benefit to, U.S. patent application Ser. No. 13/168,896, now U.S. Pat. No. 8,370,785, filed Jun. 24, 2011, to Ditzel and Burr, which is hereby incorporated herein by reference in its entirety, which in turn was a Continuation application of, and claimed benefit to, U.S. patent application Ser. No. 12/033,832, now U.S. Pat. No. 7,996,809, filed Feb. 19, 2008, to Ditzel and Burr, which is hereby incorporated herein by reference in its entirety, which in turn was a Continuation application of, and claimed benefit to, U.S. patent application Ser. No. 10/334,638, now U.S. Pat. No. 7,334,198, filed Dec. 31, 2002, to Ditzel and Burr, which is hereby incorporated herein by reference in its entirety.

FIELD OF THE INVENTION

The present invention relates to the field of electronic circuits. Specifically, embodiments of the present invention relate to a method and system for enhancing circuit performance using software to control transistor body bias.

BACKGROUND

Modern computer processors are capable of running at extraordinary speeds. However, the increased speed comes at the expense of more power consumption. The power consumption results in considerable heat dissipation when, for example, capacitive loads charge or discharge through resistive elements. Thus, a need exists for reducing power consumption. Some conventional techniques for reducing power consumption involve merely throttling back the operating frequency when the circuit does not need to be run at maximum frequency. However, the extent to which power is conserved is limited with this technique.

SUMMARY OF THE INVENTION

Software controlled transistor body bias. In one embodiment, a target frequency is accessed. Using software, transistor body-biasing values are determined for the target frequency in order to enhance a characteristic of a circuit. The bodies of the transistors are biased based on the body-biasing values, wherein the characteristic is enhanced.

BRIEF DESCRIPTION OF THE DRAWINGS

FIG. 7 is an exemplary table for storing values for body-biasing transistors in a circuit, according to embodiments of the present invention.

DETAILED DESCRIPTION OF THE INVENTION

Figure 1:
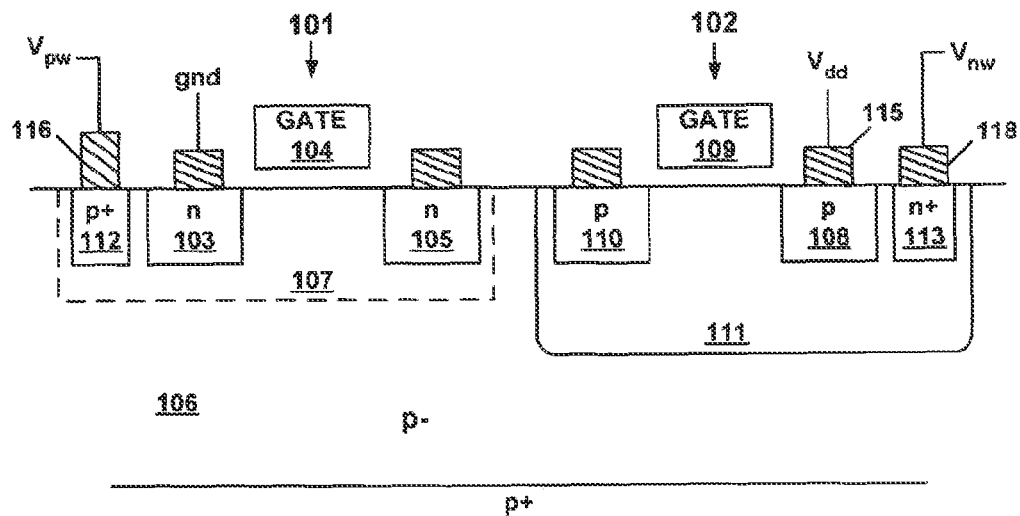
FIG. 1 is a diagram of a CMOS structure in a body-biased system.

In the following detailed description of embodiments of the present invention, a method and system for software controlled body-biasing, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing" or "receiving" or "biasing" or "processing" or "computing" or "translating" or "calculating" or "determining" or "applying" or "storing" or "outputting" or "returning" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Therefore, it would be advantageous to provide a method and system for managing characteristics of a circuit, such as a processor. It would be further advantageous to provide a method and system that handle variations in transistor operating characteristics due to processing and environmental factors when enhancing characteristics such as power consumption and operating frequency. It would be still further advantageous to provide a method and system that allow the circuit to run at a maximum frequency with minimum power consumption, given the current use of the circuit and transistor characteristics.

Embodiments of the present invention provide a method and system for managing characteristics of a circuit, such as a processor. Embodiments of the present invention provide a method and system that allow the circuit to run at a maximum frequency with minimum power consumption, given the current use of the circuit and transistor characteristics. Embodiments of the present invention provide a method and system that handle variations in transistor operating characteristics due to processing and environmental factors when enhancing characteristics such as power consumption and operating frequency. Embodiments of the present invention are able to predict an optimum body-biasing value to meet future operating conditions. Embodiments of the present invention provide these advantages and others not specifically mentioned above but described in the sections to follow.

A method of enhancing circuit performance is disclosed. The method comprises first receiving a target parameter, for example, a target frequency at which to operate a circuit having transistors. Then, transistor body-biasing values are determined, using software, for the given target parameter in order to enhance a characteristic of a circuit. The characteristic may be power consumption. Then, the body-biasing values are used to bias the body of the transistors. In this fashion, the characteristic is enhanced.

In another embodiment, the method may further comprise determining a supply voltage for the circuit, based on a target frequency in order to enhance the characteristic. In one embodiment, the determination of the body-biasing values comprises comparing changes in power consumption due to changes in threshold voltage of transistors in the circuit versus changes in power consumption due to changes in the supply voltage. In another embodiment, maximum operating frequency is determined for the circuit, based on a target supply voltage.

Yet another embodiment is a system for managing a circuit having transistors. The circuit may be a processor. The system comprises logic for determining a target frequency for the circuit coupled thereto. The system also has computer-implemented logic for determining transistor body-biasing values for the target frequency in order to enhance a characteristic of the circuit. The system further comprises circuitry for biasing bodies of transistors in the processor based on the body-biasing values, wherein the characteristic is enhanced. The logic for determining the target frequency may further be for translating instructions to be executed in the circuit. The logic for determining transistor body-biasing values may comprise a table of the body-biasing values for a range of target frequencies.

Embodiments of the present invention provide for software-controlled methods and systems for controlling threshold voltages of transistors using body-biasing. The body-biasing may be back-biasing or forward-biasing. By controlling threshold voltage in this fashion, a characteristic of the circuit may be enhanced. For example, the power consumed by a processor may be minimized by selecting optimum threshold voltages given other parameters, such as, for example, target operating frequency. Other parameters, such as operating temperature, supply voltage, transistors on and off currents may also be considered. By using software, the transistors may be controlled more accurately and more factors may be taken into consideration than may be possible or practical using hardware-only control. Further, the decision of whether to change the threshold voltage in light of the parameters can be intelligently applied with software-controlled body-biasing.

Embodiments of the present invention contemplate that, given a process (e.g., CMOS technology) for every circuit, there is a supply voltage and transistor threshold voltage that achieves a target performance (e.g., maximum operating frequency) using minimum power. This may depend on activity in the circuit (e.g., switching). Embodiments of the present invention adjust the supply voltage and transistor threshold voltages to achieve the target performance, while using minimum power.

The problem of conserving power is exacerbated by the fact that power consumption is a function of the transistors' operating characteristics, such as the leakage current, which may be a function of threshold voltage. Moreover, low threshold devices may leak too much when their circuits are in a sleep or standby mode (e.g., transistors are off). On the other hand, higher threshold transistors suffer from poor performance (e.g., switch slowly). Thus, there is no one threshold voltage that is ideal for a circuit that may be operated at different frequencies, depending on performance requirements.

Moreover, threshold voltage is not consistent and fully predictable. There are various factors that contribute to the magnitude of a transistor device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations (such as oxide thickness, and channel width and especially channel length), charge trapping in materials and interfaces, and environmental factors such as operating temperature fluctuations can shift the threshold voltage.

Recently, there have been developments using transistors as four terminal devices in order to control the transistor's characteristics. Typically, metal oxide semiconductor field effect transistors (MOSFETs) and the like are thought of as three terminal devices and are operated as such. However, the body of such transistors may be used as a fourth terminal. For example, by applying a voltage between the body and source, the threshold voltage of the transistor may be altered, as discussed below.

In the exemplary CMOS configuration of FIG. 1, the transistors are used as four terminal devices in order to alter the threshold voltage using a body-biasing technique. A basic characteristic of body-biased transistors resides in the ability to electrically tune the transistor thresholds. This is achieved by either reverse biasing or forward biasing the body of each MOS transistor relative to the source to adjust the threshold potentials. Typically, the potential will be controlled through isolated ohmic contacts to the source and well regions together with circuitry necessary for independently controlling the potential of these two regions. Exemplary of this is the structure in FIG. 1, which illustrates a configuration in which the well contacts are split off from the source contacts.

The NFET 101 is made up of an n-region source 103, a gate electrode 104, an n-region drain 105, and a p.sup.− bulk material 106. The NFET 101 may also include a p-well 107 as shown. Similarly, the PFET 102 includes p-region source 108, a gate electrode 109 and a p-region drain 110 formed in an n-well 111. Reference numeral 112 is a p.sup.+ plug which forms a bulk terminal or well tie for the bulk material 106, and reference numeral 113 is an n.sup.+ plug forming a well tie for the n-well 111.

In the body-biased CMOS design of FIG. 1, the well contact 112 of the bulk material 106 is split off from the source terminal 103 of the NFET 101 by providing a separate NFET substrate metallic rail contact 116 which is spaced from the metallic rail contact 114 of the source terminal 103. The NFET substrate rail contact 116 is connected to a bias voltage source V.sub.pw. Likewise, the well contact 113 of the n-well 111 is split off from the source terminal 108 of the PFET 102 by providing a separate PFET substrate metallic rail contact 118 which is spaced from the metallic rail contact 115 of the source terminal 108. The NFET substrate rail contact 118 is connected to a bias voltage source V.sub.nw. Thus, in this example, the substrate bias potential of the NFET 101 is set by V.sub.pw, and that of the PFET 102 is set by V.sub.nw.

Figure 2:
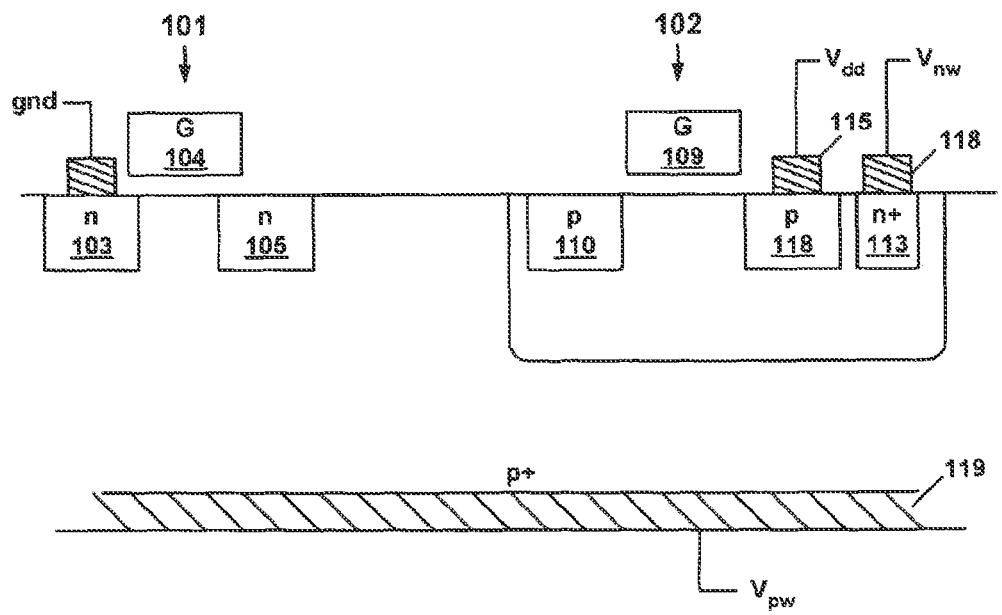
FIG. 2 is a diagram of a CMOS structure in a body-biased system.

FIG. 2 illustrates a similar design, except that the substrate or body of the NFET 101 is biased to V.sub.pw by way of a metallic back plane 119, rather than by way of a well rail tie. The PFET 102 is contacted to V.sub.nw in a similar fashion as the design of FIG. 1.

To aid in understanding some embodiments of the present invention, several principles will be briefly overviewed. A first of these is the effect of threshold voltage (V.sub.t) on performance and power. Decreasing threshold voltage increases performance (e.g., the maximum operating frequency), but increases leakage current. Thus, the threshold voltage should be low enough to allow the circuit to operate at its desired frequency but not so low that the leakage current wastes power when the transistors are inactive. For example, a high V.sub.t may be suitable to conserve power for a digital watch circuit, which does not run very fast. However, a low V.sub.t may be suitable for a digital signal processing circuit, such that it is able to switch rapidly.

A second consideration is the effect steps taken to reduce power consumption have on V.sub.t and hence, the transistors' on current (I.sub.ON) and maximum operating frequency. Thus, embodiments balance the desire to reduce power against the desired maximum operating frequency. For example, to reduce power consumption, the operating frequency and supply voltage may be lowered, as is discussed below. However, dropping the supply voltage increases the effective V.sub.t. Increases in V.sub.t reduce the saturation current (I.sub.ON) sharply, which reduces the maximum frequency at which the circuit may be run. Hence, a balance between the various factors is struck by embodiments of the present invention by using software to control the threshold voltage. It would be very difficult if not impossible to manage the various factors using only hardware.

Figure 3:
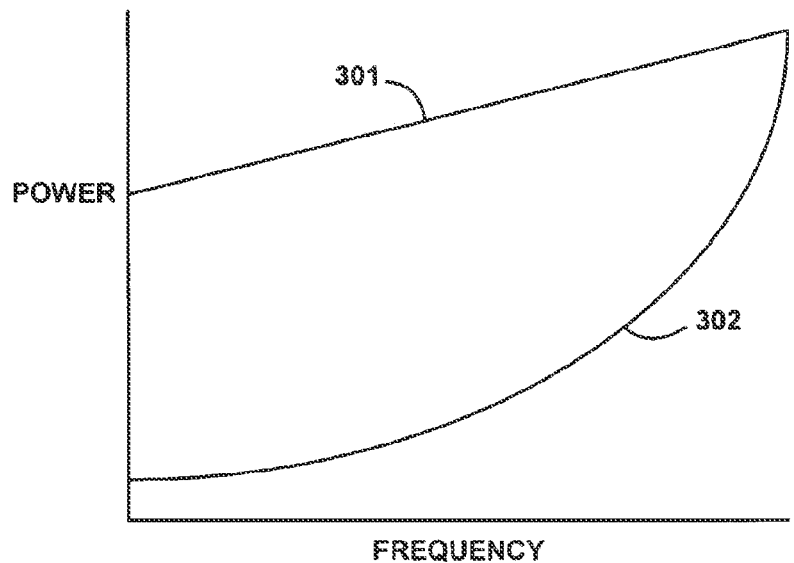
FIG. 3 is a graph of power consumption versus frequency for a transistor having an arbitrary load capacitance, for constant and varying supply voltage.

As stated above, in order to reduce power consumption, in general it is desirable to reduce the operating frequency and the supply voltage. FIG. 3 illustrates power consumption versus switching frequency for a conventional transistor. The power usage may be approximated as:

$$P = C*V^2*f + I_{OFF}*V \qquad \text{Equation 1}$$

In equation 1, P is power, C is the effective load capacitance, V is the transistor supply voltage, f is the switching frequency, and I.sub.OFF is the transistor leakage or off current. The first term on the right is the dynamic component and the second term is the static component. Dynamic power consumed by the transistor itself is included as part of the load capacitance. The curve 301 indicates power usage when frequency is varied and other parameters such as supply voltage are kept constant. As Equation 1 indicates, the power usage drops linearly with frequency with a y-intercept given by the static component. Some conventional systems conserve power by simply throttling back the frequency when the circuit does not need to be operated at a high frequency.

However, as curve 302 and Equation 1 indicate, even more power can be conserved by dropping the supply voltage as frequency is dropped. For example, the supply voltage appears to the second power in the dynamic power term. Analysis of the static power component is more complex. While supply voltage appears to the first power in the static component, a drop in the supply voltage also affects I.sub.OFF. For example, dropping the supply voltage increases the threshold voltage, as in indicated by Equation 2, in which V.sub.t is the operating threshold voltage, V.sub.t0 is the original (inherent) threshold voltage, "dibl" is the drain induced barrier lowering, and V.sub.dd is the supply voltage.

$$V_t = V_{t0} - dibl*V_{dd} \qquad \text{Equation 2}$$

Equation 2 indicates that as the supply voltage decreases, the threshold voltage V.sub.t, increases. Analysis of the leakage current is quite complex is it comprises several components: off-state sub-threshold leakage, gate direct tunneling leakage, and source/drain junction leakage currents. However, increases in V.sub.t, in turn, decrease the leakage current (I.sub.OFF), as the leakage current is exponential in V.sub.t, and is therefore, by Equation 2, exponential in the supply voltage, approximately doubling for each 0.3 Volt increase in V.sub.dd. Thus, it is desirable to decrease the supply voltage along with the operating frequency to conserve power.

However, the increase in V.sub.t negatively impacts maximum operating frequency. In summary, dropping the supply voltage increases the effective threshold voltage, which drops I.sub.ON, which drops maximum operating frequency. The effect of dropping the supply voltage on V.sub.t has already been discussed. Equation 3 demonstrates a relationship between V.sub.t and I.sub.ON for a transistor in saturation $$I_{ON} = v_{SAT} C_{ox} W(V_{gs} - V_t - V_{dsat}) \qquad \text{Equation 3}$$

In Equation 3, v.sub.SAT is the saturation velocity, V.sub.gs is the gate to source voltage, C.sub.ox is the capacitance per unit area of the gate-to-channel capacitor, W is channel width, and V.sub.dsat is the saturation voltage. While equation 3 describes a short channel device, the present invention is not limited to short channel devices.

From Equation 3 it is clear that I.sub.ON drops rapidly as V.sub.t is increased. This, in turn, reduces the maximum frequency of the circuit. The maximum frequency may be approximated by Equation 4, in which C is the load capacitance, V.sub.dd is the power supply, and I.sub.ON is the transistor's drain to source current in saturation.

$$f_{max} \propto I_{ON}/(C*V_{dd}) \qquad \text{Equation 4}$$

Figure 4:
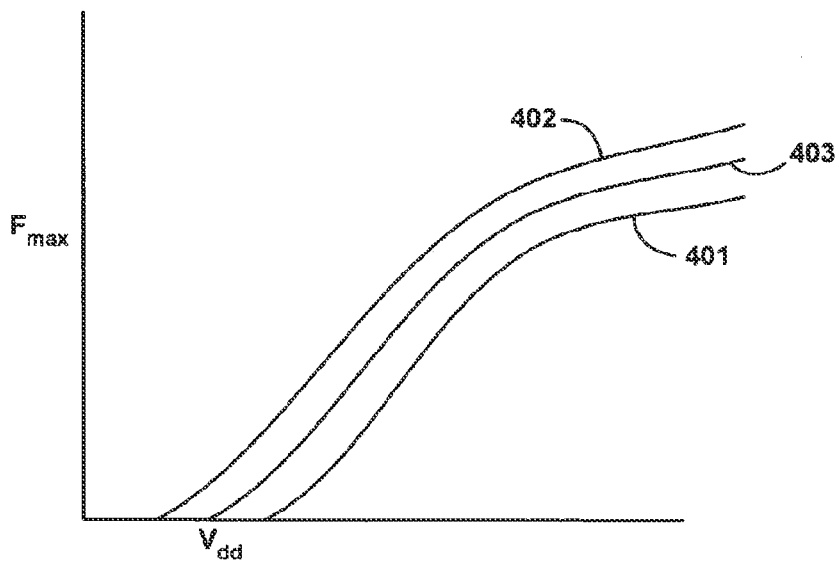
FIG. 4 is a graph of frequency versus supply voltage for various threshold voltages showing selecting between various curves and points thereon, according to embodiments of the present invention.

FIG. 4 illustrates the maximum operating frequency as a function of V.sub.dd, for various values of V.sub.t. Curve 401 corresponds to the highest V.sub.t and curve 402 to the lowest. Thus, for a given V.sub.dd the lowest V.sub.t curve 402 is able to run at the highest frequency. Further, as indicated above, as V.sub.t changes so does I.sub.ON and hence f.sub.max. As curves 401-403 indicate, the maximum frequency drops slowly at first when V.sub.dd is lowered from its highest value. However, there is a sharp drop-off in f.sub.max when V.sub.dd is dropped even further. Equations 2-4 indicate reasons for this behavior. From Equation 4, it is noted that if the effect of V.sub.dd on I.sub.ON were ignored, dropping V.sub.dd would decrease f.sub.max. However, Equations 2 and 3 indicate that dropping V.sub.dd decreases I.sub.ON, which, from Equation 4, decreases f.sub.max. Moreover, Equation 3 indicates that I.sub.ON decreases rapidly with increases in $V_t$. Thus, referring to Equation 4, the rapid decrease in $I_{ON}$ as $V_t$ increases causes $f_{max}$ to fall although $V_{dd}$ is falling as well. Embodiments of the present invention calculate optimum running characteristics (e.g., frequency, power consumption) by balancing the various factors discussed above and arriving at suitable parameters such as, $V_{dd}$ and values for body-biasing to set $V_t$. However, embodiments of the present invention are not limited to the factors discussed herein, as they may be considered exemplary.

In one embodiment of the present invention, the transistors are fabricated with a very low $V_t$. For example, the $V_t$ curve would be far to the left in FIG. 4 and hence be able to operate at a very high frequency, if desired. However, devices with a very low $V_t$ undesirably have a high $I_{OFF}$, as described above. Thus, body-biasing is used to raise the $V_t$ to a level that is optimum or at least very near optimum for the variables discussed herein and the like. For example, body-biasing may be used to effectively move from, for example, curve 402 to curve 403 to reduce $I_{OFF}$ while still allowing the circuit to run at a fast enough $f_{max}$. However, it is not required that the transistors be fabricated with a low $V_t$. Thus, in summary, the circuit may be able to run faster when the curve in FIG. 4 is far to the left because $I_{ON}$ is relatively high, but it may consume more power when the circuit is quiescent because $I_{OFF}$ is also relatively high.

Body-biasing may also be used to move to a curve further to the left in FIG. 4. In this case, the body-biasing may be described as forward-biasing and may lower $V_t$. Back-biasing may be used to move to a curve further to the right.

Embodiments of the present invention determine an appropriate supply voltage and threshold voltage for a target operating frequency while conserving power. The target operating frequency may be based on circuit utilization (e.g., processor utilization). As the previous discussion explains, extra power can be conserved by dropping the supply voltage, but this may not be dropped too low or the circuit will not be able to meet the target operating frequency. Moreover, $V_t$ affects both power consumption and $f_{max}$.

Figure 5A:
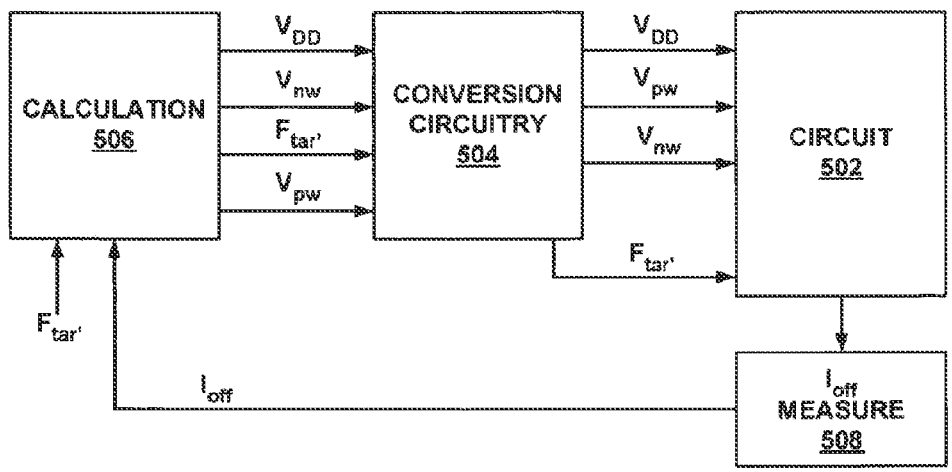
FIG. 5A, FIG. 5B, and FIG. 5C are exemplary systems for enhancing performance in a circuit using software controlled body-biasing, according to embodiments of the present invention.

FIG. 5A is an exemplary system 500 for enhancing performance in a circuit 502 using software-controlled body-biasing according to embodiments of the present invention. The system 500 comprises a circuit 502 whose characteristics are being modified. The circuit 502 may have CMOS transistors, although this is not intended to be limiting. The system 500 is provided a target operating frequency ($f_{tar}$), from which values for the supply voltage value ($V_{dd}$), and body-biasing values ($V_{nw}$, $V_{pw}$) are calculated by calculation block 506. These may be digital values. Referring again to FIG. 4, this may be described as picking an appropriate curve with $f_{max}$ fixed, while considering the effect that different $V_t$ and $V_{dd}$ have on power consumption. For example, in one embodiment, changes in power consumption due to changes in $I_{OFF}$ (which in turn may be due to which $V_t$ curve is being analyzed) are compared to changes in power consumption due to changes in $V_{dd}$. The analysis may include factoring in how often the transistors will be called upon to switch. In this example, the $V_{dd}$ may be the value needed to achieve $f_{max}$ on the analyzed $V_t$ curve.

The supply voltage value and body-biasing values are input to conversion circuitry 504 for converting those values into analog signals to be input to the circuit 502 under modification. Those of ordinary skill in the art are able to appropriately apply these values to the circuit. The target frequency ($F_{tar}$) may also be applied to the circuit 502. This may be the exact value input to the calculation block and hence does not have to be modified therein. However, embodiments do provide for running the circuit 502 at a different frequency than the target frequency, if, for example, the calculation frequency determines that another frequency is more appropriate. Those of ordinary skill in the art are able to modify the circuit's frequency.

From time to time, the system 500 measures $I_{OFF}$ with the $I_{OFF}$ measure block 508 from one or more transistors in the circuit 502 and uses that value to adjust the calculation of appropriate values. Rather than measuring $I_{OFF}$, embodiments of the present invention may measure another parameter, such as, for example, temperature. This parameter may then be fed to the calculation block 506. Thus, the circuit has a means of compensating for both processing and environmental variations in the transistors. Measurements may be performed at multiple locations in the circuit 502 to handle variations between transistors, if desired. Thus, there may be separate $V_{pw}$ and $V_{nw}$ signals sent to different regions of the circuit 502.

In one implementation, the calculation is performed as a table lookup. Exemplary tables are illustrated in FIG. 7. From time to time, the value of $I_{OFF}$ may be used to rewrite the table values. Alternatively, the system 500 may have a number of tables. The value of $I_{OFF}$ may be used to select the appropriate table. For example, the measured $I_{OFF}$ may serve as a way to measure temperature. Each table in the system 500 may cover a small range in the expected operating temperature range. Those of ordinary skill in the art will understand that the determination of the values does not have to be performed as a table lookup. For example, an algorithm may be used to dynamically calculate appropriate values for $V_{dd}$, $V_{pw}$, and $V_{nw}$.

Figure 5B:
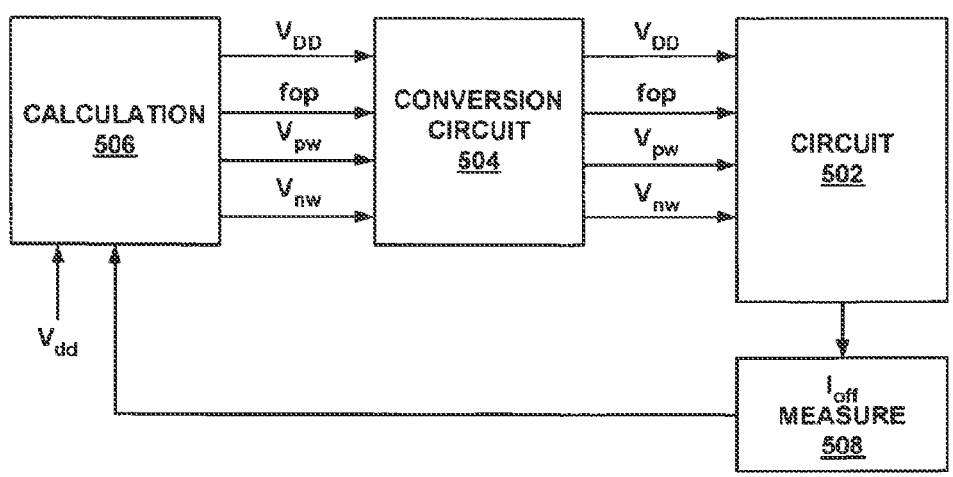

FIG. 5B illustrates an embodiment of a system 520 in which rather than inputting a target frequency, the system 520 inputs a target supply voltage, $V_{dd}$. Based on this value, the system 520 calculates an operating frequency ($f_{op}$), a $V_{pw}$, and a $V_{nw}$. The operating frequency may be the maximum frequency at which the circuit 502 may be run given the supply voltage and the selected $V_t$. Referring again to FIG. 4, this may be described as picking an appropriate curve to maximize $f_{max}$ with $V_{dd}$ fixed. As with system 500 of FIG. 5A, an $I_{OFF}$ value may be measured from time to time and used in the calculation of $f_{op}$, $V_{pw}$, and $V_{nw}$.

Figure 5C:
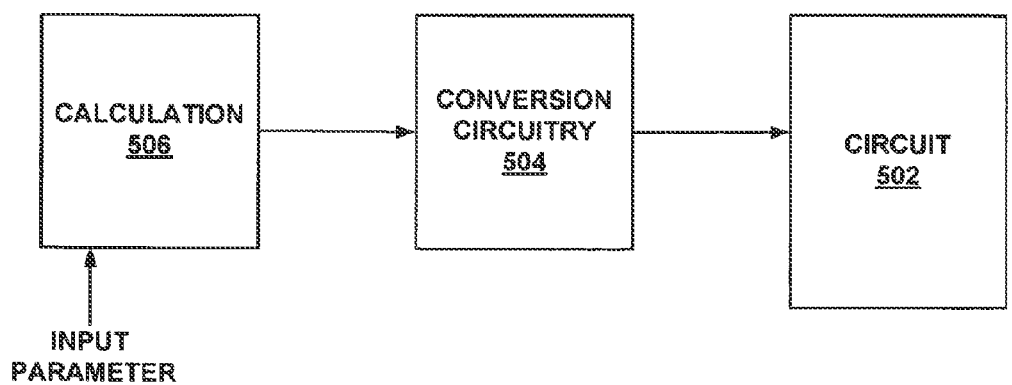

FIG. 5C illustrates an embodiment of a system 540 in which an arbitrary parameter is input to the calculation block 506. The arbitrary parameter may be, for example, a target operating frequency or a target supply voltage. However, embodiments of the present invention are not so limited. Based on the input parameter, the system 540 determines transistor body-biasing values for the target parameter in order to enhance a characteristic of a circuit. The system 540 may enhance power consumption or maximum operating frequency. However, embodiments of the present invention are not so limited. The system 540 may determine other circuit parameters, such as, for example, $V_{dd}$ or operating frequency, depending on what parameter was input. While not shown, those of ordinary skill in the art will recognize that an $I_{OFF}$ measurement circuit or the like may be added to system 540.

Figure 6:
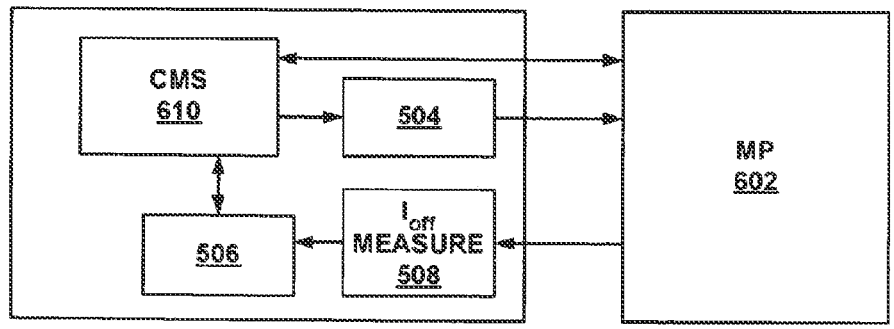
FIG. 6 is an exemplary block diagram illustrating a system for managing a circuit, according to embodiments of the present invention.

FIG. 6 is an exemplary block diagram 600 illustrating a system for managing a circuit, according to embodiments of the present invention. In FIG. 6, the microprocessor 602 is the circuit whose operation is being modified. However, embodiments of the present invention are not limited to a microprocessor 602. Coupled to the microprocessor 602 is code morphing software (CMS) 610. The CMS 610 has access to the instructions that are to be executed in the microprocessor 602 and is able to translate them. For example, the instructions to be executed may have been written for a different processor. The CMS 610 translates and enhances the instructions for the actual processor in the system.

As the CMS 610 has knowledge of the instructions currently being executed and those to be executed, it is able to very effectively determine current processor utilization and to predict future utilization. Thus, it is able to determine at what frequency the processor needs to execute over a time span. The CMS 610 feeds this target frequency to the calculation block 506, which determines appropriate circuit parameters as discussed above.

FIG. 7 is an exemplary table 700 for determining circuit parameters, according to an embodiment of the present invention. The exemplary table 700 comprises entries for $f_{max}$, $V_{dd}$, $V_{pw}$, and $V_{nw}$. In table 700, the first line of entries has a $V_{pw}$ of 0.2 V and $V_{nw}$ of −0.2 V and is suitable for forward-biasing a body/source junction. The entries with $V_{pw}$ of −1V and −2V are suitable for back-biasing the body/source junction. A typical table can contain many more entries.

Figure 8:
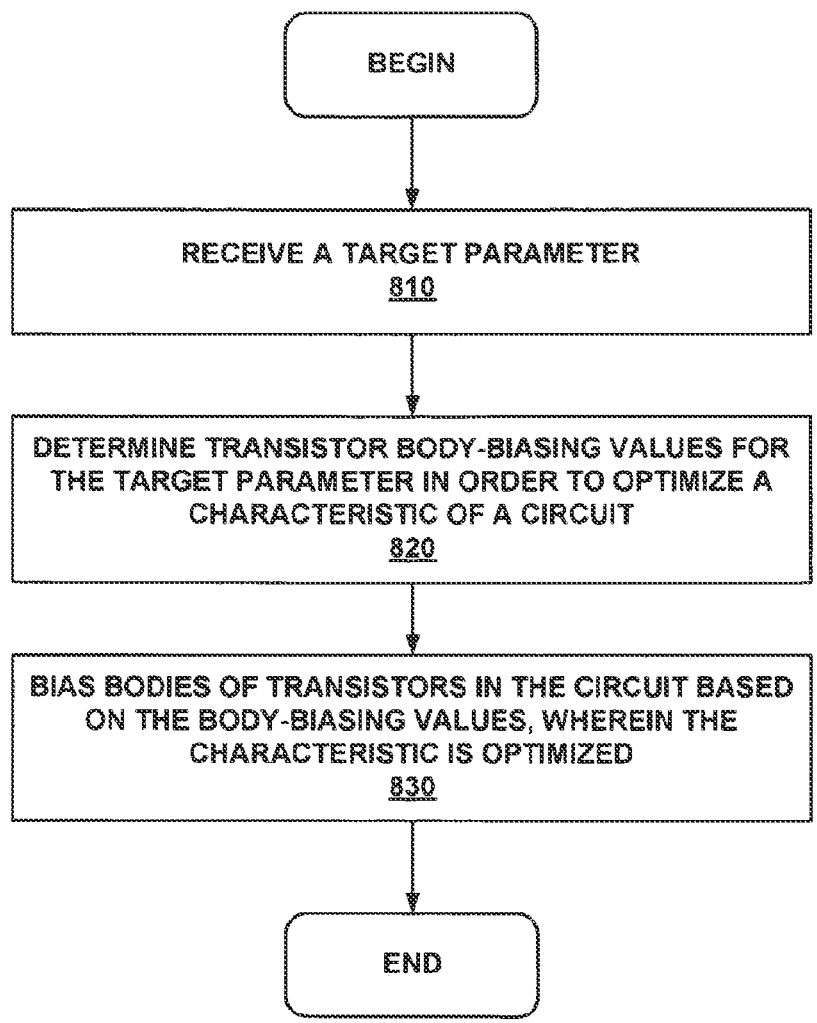
FIG. 8 and FIG. 9 are flowcharts illustrating steps of processes of enhancing circuit performance, according to embodiments of the present invention.

An embodiment of the present invention is a method of enhancing a characteristic of a circuit, using software-controlled body-biasing. At least some steps of process 800 of FIG. 8 may be stored as instructions on a computer readable medium and executed on a general-purpose processor (e.g., computer system 100 of FIG. 10). Referring to process 800 in FIG. 8, in step 810 a target parameter is received. The target parameter may be a target frequency or $V_{dd}$, but is not limited thereto.

In step 820, transistor body-biasing values are determined for the target parameter in order to enhance a characteristic of a circuit. The characteristic to be enhanced may be power consumption, which is enhanced for the given input parameter. The determination may involve table lookup or a calculation on-the-fly based on a mathematical relationship. Depending on what the input parameter was, various embodiments may also calculate a $V_{dd}$ or a maximum operating frequency. Other parameters may be determined as well.

The determination may involve predicting activity of the circuit. For example, an operating frequency, such as a maximum operating frequency may be predicted. Alternatively, a leakage current in the circuit can be predicted. The prediction can be made by the CMS and may be used to determine a future threshold value.

The determination in step 820 may involve balancing various considerations, which may be difficult or impossible to perform without the use of software. The balancing of the various considerations may be stated in many ways and no such expression contained in this description is limiting. As described herein, selecting a body-bias value alters $V_t$, which in turn alters both $I_{ON}$ and $I_{OFF}$. As maximum operating frequency depends on $I_{ON}$, and quiescent power consumption depends on $I_{OFF}$, these factors are balanced given the current use of the circuit (e.g., the frequency at which transistors are switching). Moreover, the value of $V_{dd}$ also affects the balancing process. In one embodiment, changes in power consumption due to changes in $I_{OFF}$ (e.g., from changes in $V_t$) are compared to changes in power consumption due to changes in $V_{dd}$ (e.g., necessary to achieve $f_{max}$ on a given $V_t$ curve in FIG. 4). In another embodiment, changes in power consumption due to changes in $I_{ON}$ (e.g., from changes in $V_t$) are compared to changes in power consumption due to changes in $V_{dd}$. However, many other balancing tests are possible. Based on the comparison, appropriate values for $V_{dd}$, $V_{pw}$, and $V_{nw}$ are selected.

In step 830, bodies of transistors in the circuit are body-biased in order to establish a $V_t$ that is desired. This may be either back-biasing or forward-biasing. Furthermore, depending on the embodiment being practiced, the supply voltage ($V_{dd}$) may be altered with the newly determined value, or the operating frequency may be changed with a determined frequency. When using software controlled body-biasing, the step of changing the threshold voltage by applying a new body-bias may be intelligently applied by determining that it is better to not change the body-bias at this time. For example, changing the body-bias consumes some measure of power due to, for example, capacitive charging. If the trade off between the power saved by the change in threshold voltage is outweighed by the power consumed making the change, the change can be foregone.

Figure 9:
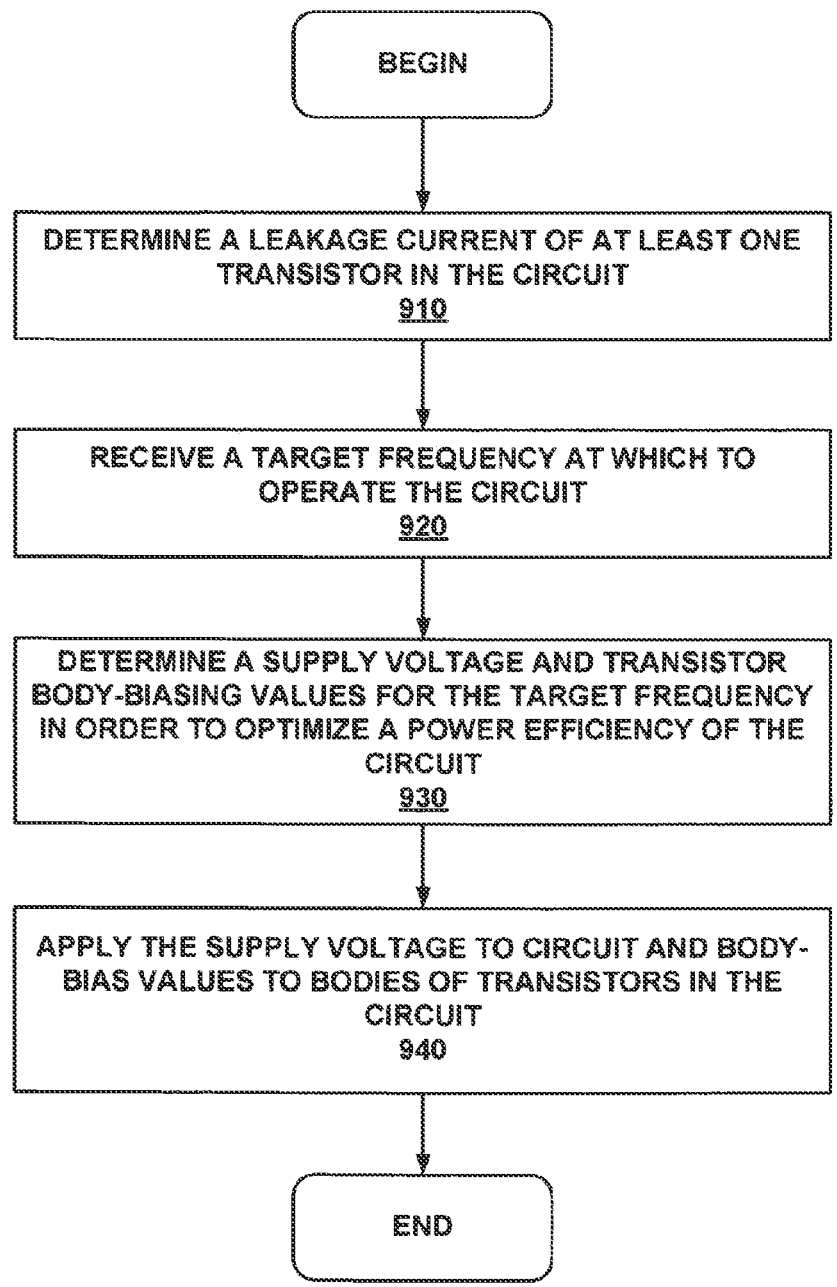

An embodiment of the present invention is a computer-implemented method of enhancing a characteristic of a circuit, using software-controlled body-biasing. At least some steps of process 900 of FIG. 9 may be stored as instructions on a computer readable medium and executed on a general-purpose processor. In step 910, a leakage current of at least one transistor in the circuit is measured.

In step 920, a target frequency is received. The target frequency may be determined by CMS or the like and may be based on utilization of a processor whose operating characteristics are being controlled by process 900.

In step 930, a supply voltage and transistor body-biasing values are determined for the target frequency. Moreover, the leakage current measured in step 910 may be factored into the determination. The resulting values may serve to enhance power consumption. The determination may involve table lookup or calculation on-the-fly. The determination in step 930 may involve balancing various considerations, which may be difficult or impossible to perform without the use of software. Based on the comparison, appropriate values for $V_{dd}$, $V_{pw}$, and $V_{nw}$ are selected.

In step 930, the determined supply voltage and body-bias values are applied to the circuit. The body-biasing establishes a desired $V_t$ in the circuit. In this fashion, the circuit may be run at a desired frequency with minimum power consumption.

Figure 10:
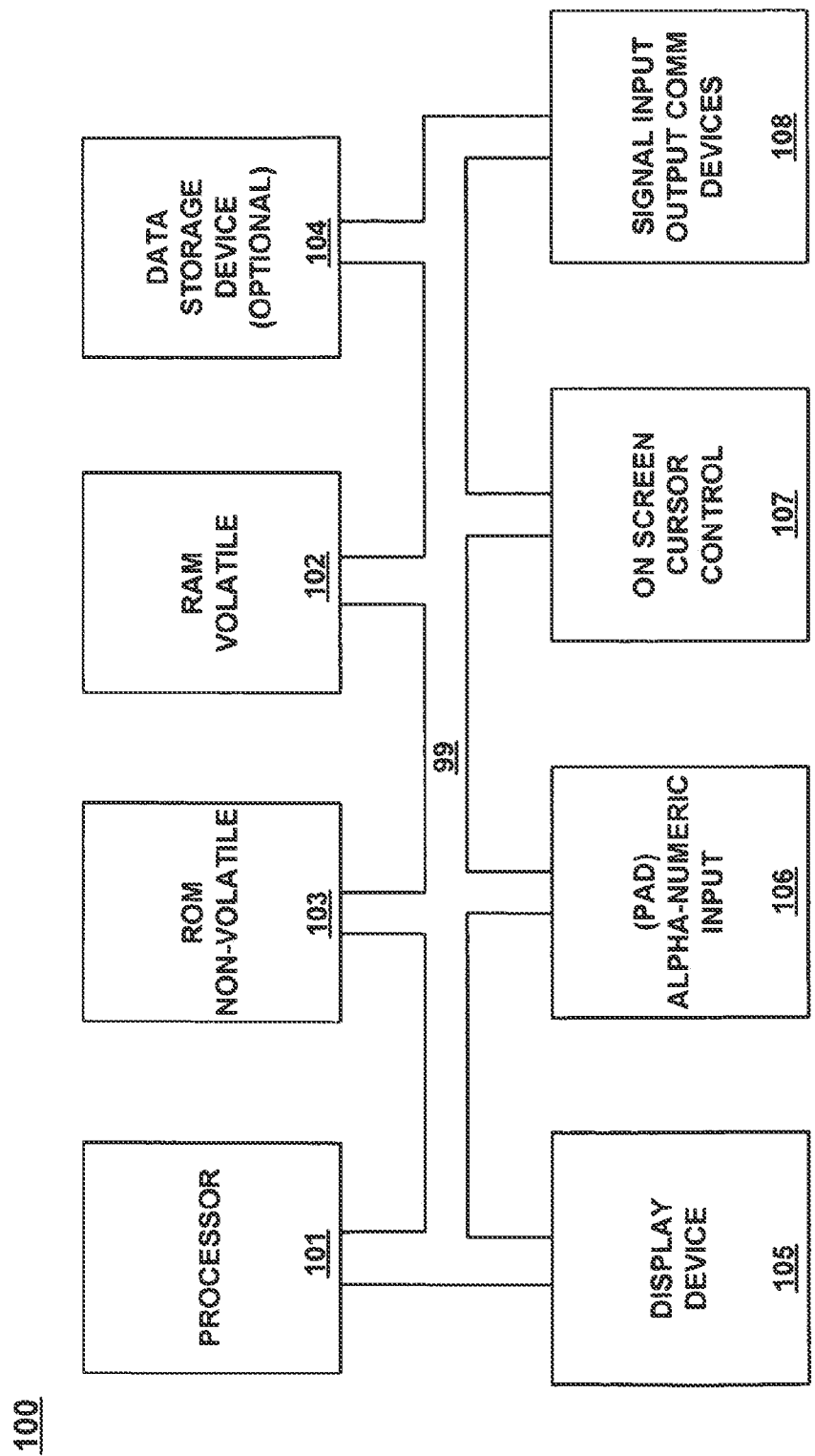
FIG. 10 is an exemplary computer system that may serve as a platform upon which embodiments of the present invention may be executed.

FIG. 10 illustrates circuitry of an exemplary computer system 100, which may form a platform for embodiments of the present invention. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 10, system 100 also includes an optional alphanumeric input device 106 including alphanumeric and function keys coupled to bus 99 for communicating information and command selections to central processor unit 101. System 100 also includes a cursor control device 107 coupled to bus 99 for communicating user input information and command selections to central processor unit 101. System 100 of the present embodiment also includes a display device 105 coupled to bus 99 for displaying information. A signal input/output communication device 108 coupled to bus 99 provides communication with external devices.

The preferred embodiment of the present invention, a method and system for software controlled body-biasing, is thus described. While the present invention has been described in particular embodiments, it should be appreciated that the present invention should not be construed as limited by such embodiments, but rather construed according to the below claims.

What is claimed is:

1. A computer-implemented method comprising:
   operating transistors in a circuit at a threshold voltage; and
   comparing a predicted energy cost of changing the threshold voltage of said transistors in said circuit from a first threshold voltage to a second threshold voltage to a predicted energy benefit of operating said circuit at said second threshold voltage relative to operating said circuit at said first threshold voltage.

2. The method of claim 1 further comprising:
   changing said threshold voltage of said transistors to said second threshold voltage.

3. The method of claim 2 wherein said changing is responsive to said comparing.

4. The method of claim 3 wherein said changing is responsive to said predicted energy benefit being greater than said predicted energy cost.

5. The method of claim 3 further comprising:
   accessing a target parameter of said circuit operating at said first threshold voltage; and
   determining said second threshold voltage to enhance a characteristic of said circuit.

6. The method of claim 5, wherein said target parameter is a target frequency for said circuit.

7. The method of claim 5, wherein said characteristic is power efficiency for said circuit.

8. The method of claim 1 wherein said changing a threshold voltage comprises changing a body biasing voltage applied to said transistors.

9. A computer system comprising:
   circuitry configured to compare a predicted energy cost of changing a threshold voltage of transistors in a circuit from a first threshold voltage to a second threshold voltage to a predicted energy benefit of operating said circuit at said second threshold voltage relative to operating said circuit at said first threshold voltage.

10. The computer system of claim 9 further comprising:
    circuitry configured to change said threshold voltage of said transistors to said second threshold voltage.

11. The computer system of claim 10 wherein said circuitry configured to change is further configured to change responsive to a comparison performed by said circuitry configured to compare.

12. The computer system of claim 11 wherein said circuitry configured to change is responsive to said predicted energy benefit being greater than said predicted energy cost.

13. The computer system of claim 11 further comprising:
    circuitry configured to access a target parameter of said circuit operating at said first threshold voltage; and
    circuitry configured to determine said second threshold voltage to enhance a characteristic of said circuit.

14. The computer system of claim 13, wherein said target parameter is a target frequency for said circuit.

15. The computer system of claim 13, wherein said characteristic is power efficiency for said circuit.

16. An article of manufacture including a computer readable storage medium having stored therein instructions that, responsive to execution by a computing device, cause the computing device to perform operations comprising:
    operating transistors in a circuit at a threshold voltage; and
    comparing a predicted energy cost of changing the threshold voltage of said transistors in said circuit from a first threshold voltage to a second threshold voltage to a predicted energy benefit of operating said circuit at said second threshold voltage relative to operating said circuit at said first threshold voltage.

17. The article of manufacture of claim 16 wherein said operations further comprise:
    changing said threshold voltage of said transistors to said second threshold voltage.

18. The article of manufacture of claim 16 wherein said changing is responsive to said predicted change in energy usage resulting from said operating being greater than said change in energy usage resulting from said changing.

19. The article of manufacture of claim 16 wherein said operations further comprise:
    accessing a target parameter of said circuit operating at said first threshold voltage; and
    determining said second threshold voltage to enhance a characteristic of said circuit.

20. The article of manufacture of claim 16 wherein said operations further comprise:
    changing a body biasing voltage applied to said transistors to change said threshold voltage.

* * * * *